(12) United States Patent
Selvamanickam

(10) Patent No.: US 7,914,848 B2
(45) Date of Patent: Mar. 29, 2011

(54) TAPE-MANUFACTURING SYSTEM HAVING EXTENDED OPERATIONAL CAPABILITIES

(75) Inventor: Venkat Selvamanickam, Wynantskill, NY (US)

(73) Assignee: Superpower, Inc., Schenectady, NY (US)

( * ) Notice: Subject to any disclaimer, the term of this patent is extended or adjusted under 35 U.S.C. 154(b) by 915 days.

(21) Appl. No.: 11/451,934

(22) Filed: Jun. 13, 2006

(65) Prior Publication Data

US 2006/0231033 A1     Oct. 19, 2006

Related U.S. Application Data

(62) Division of application No. 10/701,192, filed on Nov. 4, 2003, now abandoned.

(51) Int. Cl.
*C23C 16/00* (2006.01)

(52) U.S. Cl. .................. 427/248.1; 427/62; 427/596

(58) Field of Classification Search .............. 427/62, 427/596, 248.1
See application file for complete search history.

(56) References Cited

U.S. PATENT DOCUMENTS

| | | |
|---|---|---|
| 3,303,320 A | 2/1967 | Muller |
| 4,079,482 A | 3/1978 | Yeh |
| 4,247,907 A | 1/1981 | Durbeck et al. |
| 4,281,342 A | 7/1981 | Ueda et al. |
| 4,344,127 A | 8/1982 | McDaniel et al. |
| 4,396,976 A | 8/1983 | Hyatt |
| 4,449,052 A | 5/1984 | Krieg |
| 4,646,223 A | 2/1987 | Sekiguchi |
| 4,661,001 A | 4/1987 | Takai et al. |
| 4,841,908 A | 6/1989 | Jacobson et al. |
| 4,888,202 A | 12/1989 | Murakami et al. |
| 4,889,367 A | 12/1989 | Miller |
| 4,891,821 A | 1/1990 | Hanks |
| 4,916,600 A | 4/1990 | Ropelato |
| 5,153,418 A | 10/1992 | Batterman et al. |
| 5,170,044 A | 12/1992 | Pastor |
| 5,189,292 A | 2/1993 | Batterman et al. |
| 5,227,363 A | 7/1993 | Furukawa et al. |

(Continued)

FOREIGN PATENT DOCUMENTS

EP     0 468 488 A1     1/1992

(Continued)

OTHER PUBLICATIONS

C. Mitchinson et al, J. Phys. E. Sic (1972). Instrum. 5, 742-743.*

(Continued)

*Primary Examiner* — Timothy H Meeks
*Assistant Examiner* — Tabassom Tadayyon Eslami
(74) *Attorney, Agent, or Firm* — Larson Newman & Abel LLP

(57) ABSTRACT

A tape-manufacturing system for coating at least one tape substrate such as, for example, for the manufacture of a high-temperature superconductor (HTS) conductor is disclosed. The tape-manufacturing system includes at least two electron beam (e-beam) deposition sources, at least one assist source and, optionally, a controller. Each e-beam deposition source may be in-process repairable. Each e-beam deposition source is capable of communicating an evaporant material with at least a portion of at least one tape substrate to deposit a coating thereon. The at least one assist source is capable of communicating a beam of a species to the coating. The controller communicates with the at least two e-beam deposition sources and the at least one assist source.

17 Claims, 7 Drawing Sheets

U.S. PATENT DOCUMENTS

| | | | |
|---|---|---|---|
| 5,254,911 A | 10/1993 | Avnery et al. | |
| 5,262,194 A | 11/1993 | Bischer, Jr. et al. | |
| 5,288,986 A | 2/1994 | Pine et al. | |
| 5,296,693 A | 3/1994 | Hughes-Hartogs | |
| 5,298,731 A | 3/1994 | Ett | |
| 5,304,787 A | 4/1994 | Wang | |
| 5,351,200 A | 9/1994 | Impink, Jr. | |
| 5,355,001 A | 10/1994 | Fujimoto et al. | |
| 5,357,094 A | 10/1994 | Baldwin | |
| 5,468,945 A | 11/1995 | Huggett et al. | |
| 5,507,931 A | 4/1996 | Yang | |
| 5,563,401 A | 10/1996 | Lemelson | |
| 5,579,218 A | 11/1996 | Ehlig et al. | |
| 5,650,378 A * | 7/1997 | Iijima et al. | 505/473 |
| 5,689,415 A | 11/1997 | Calotychos et al. | |
| 5,726,912 A | 3/1998 | Krall, Jr. et al. | |
| 5,739,086 A | 4/1998 | Goyal et al. | |
| 5,741,377 A | 4/1998 | Goyal et al. | |
| 5,872,080 A | 2/1999 | Arendt et al. | |
| 5,888,305 A | 3/1999 | Szczyrbowski | |
| 5,898,020 A | 4/1999 | Goyal et al. | |
| 5,958,599 A | 9/1999 | Goyal et al. | |
| 5,964,966 A | 10/1999 | Goyal et al. | |
| 5,980,078 A | 11/1999 | Krivoshein et al. | |
| 6,022,832 A | 2/2000 | Fritzemeier et al. | |
| 6,027,564 A | 2/2000 | Fritzemeier et al. | |
| 6,032,861 A | 3/2000 | Lemelson et al. | |
| 6,063,244 A | 5/2000 | Pinarbasi | |
| 6,103,069 A | 8/2000 | Davenport | |
| 6,106,615 A | 8/2000 | Goyal et al. | |
| 6,156,170 A | 12/2000 | Akari et al. | |
| 6,156,376 A | 12/2000 | Paranthaman et al. | |
| 6,190,752 B1 | 2/2001 | Do et al. | |
| 6,214,183 B1 | 4/2001 | Maishev et al. | |
| 6,225,717 B1 | 5/2001 | Burger et al. | |
| 6,225,747 B1 | 5/2001 | Fremgen, Jr. et al. | |
| 6,252,339 B1 | 6/2001 | Kendall | |
| 6,294,479 B1 | 9/2001 | Ebe et al. | |
| 6,331,199 B1 | 12/2001 | Goyal et al. | |
| 6,383,989 B2 | 5/2002 | Jia et al. | |
| 6,426,320 B1 | 7/2002 | Fritzemeier et al. | |
| 6,426,997 B1 * | 7/2002 | Fuchs et al. | 378/118 |
| 6,447,714 B1 | 9/2002 | Goyal et al. | |
| 6,451,450 B1 | 9/2002 | Goyal et al. | |
| 6,458,223 B1 | 10/2002 | Hans Thieme et al. | |
| 6,475,311 B1 | 11/2002 | Fritzemeier et al. | |
| 6,541,121 B2 | 4/2003 | Usoskin | |
| 6,543,691 B1 | 4/2003 | Lemelson et al. | |
| 6,562,761 B1 | 5/2003 | Fritzemeier et al. | |
| 6,599,346 B2 | 7/2003 | Goyal et al. | |
| 6,602,313 B2 | 8/2003 | Goyal et al. | |
| 6,607,838 B2 | 8/2003 | Goyal et al. | |
| 6,607,839 B2 | 8/2003 | Goyal et al. | |
| 6,610,413 B2 | 8/2003 | Goyal et al. | |
| 6,610,414 B2 | 8/2003 | Goyal et al. | |
| 6,610,632 B2 | 8/2003 | Honjo et al. | |
| 2002/0081371 A1 | 6/2002 | Cheong | |
| 2003/0054105 A1 | 3/2003 | Hammond et al. | |
| 2003/0157742 A1 | 8/2003 | Honda et al. | |
| 2003/0193294 A1 | 10/2003 | Wahlin | |
| 2004/0168636 A1 | 9/2004 | Savvides et al. | |
| 2004/0258851 A1 | 12/2004 | Selvamanickam et al. | |
| 2004/0261707 A1 | 12/2004 | Selvamanickam et al. | |
| 2004/0261708 A1 | 12/2004 | Selvamanickam et al. | |
| 2005/0011747 A1 | 1/2005 | Selvamanickam et al. | |

FOREIGN PATENT DOCUMENTS

| | | | |
|---|---|---|---|
| GB | 2185620 | * | 7/1987 |
| JP | 58-100676 | | 6/1983 |
| JP | 01-208456 | | 8/1989 |
| JP | 63-03968 | | 8/1989 |
| JP | 1208456 | * | 8/1989 |
| JP | 03-013567 | | 1/1991 |
| JP | 06-192823 | | 7/1994 |
| WO | WO 02/095084 | * | 11/2002 |

OTHER PUBLICATIONS

Hammond, Thick film YBCO for Wires and Tapes: scale-up Issues and Cost Estimates; Advances in Superconductivity VII Proc. 8th Int. Sump. Sepercond. (ISS), Springer-Verlag, Tok.

Handbook of Deposition Technologies for Films and Coatings, Science, Technology and Applications, Second ED., University of California at Los Angeles, Ion Plating by Donald Ma.

* cited by examiner

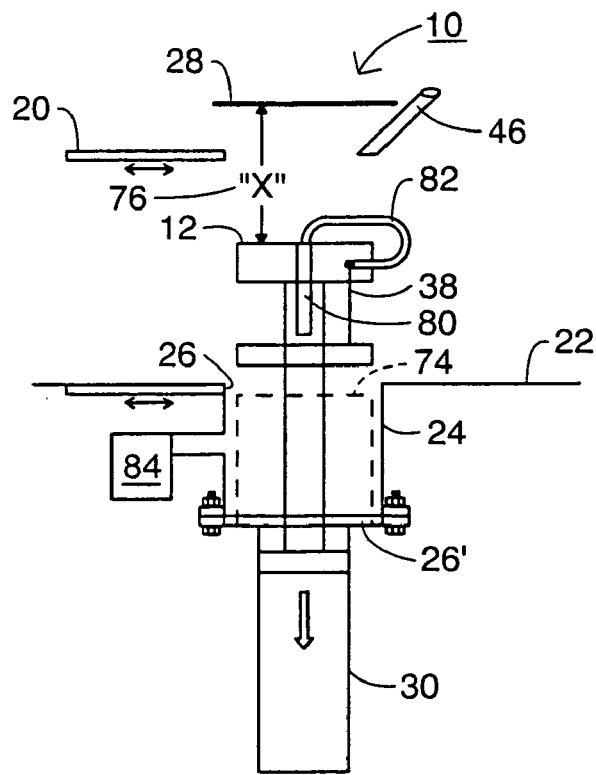
FIG. 3A
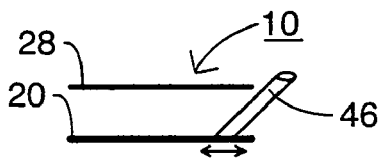
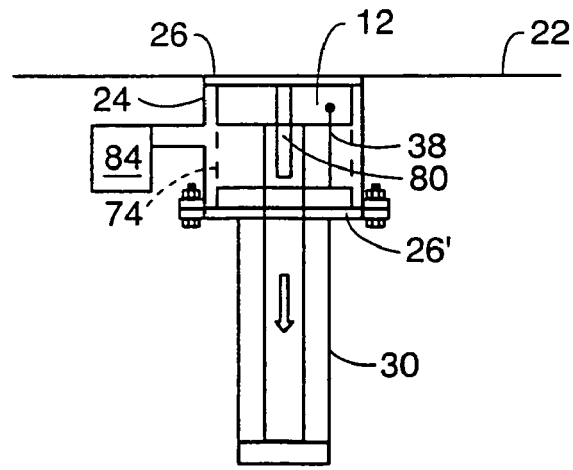
FIG. 3B

1

TAPE-MANUFACTURING SYSTEM HAVING EXTENDED OPERATIONAL CAPABILITIES

CROSS-REFERENCE TO RELATED APPLICATION(S)

The present application is a divisional application of U.S. application Ser. No. 10/701,192, filed Nov. 4, 2003 now abandoned, which is incorporated herein by reference in its entirety.

The present invention relates generally to a tape-manufacturing system and, more particularly, to a tape-manufacturing system for economically coating a tape substrate to manufacture, for example, a textured coating on the tape substrate.

BACKGROUND OF INVENTION

The discovery of ceramic-based high-temperature superconductor (HTS) materials during the 1980's opened the possibility of applying superconducting technology to electric power devices such as transmission cable, transformers, motors, and generators. The 'high' in HTS refers to the ability to achieve the superconducting state at temperatures attainable using inexpensive liquid nitrogen, rather than the liquid helium required by the 'low' temperature superconductors (LTS). Nitrogen gas, when cooled, condenses at −195.8° C. (77.36 K) and freezes at −209.86° C. (63.17 K), while helium gas condenses at −268.93° C. (4.2 K) and does not freeze at atmospheric pressure.

Due to superconductivity, an HTS conductor has resistive losses that are decreased to almost negligible levels. Achieving the decreased resistive losses now costs less since the higher temperatures significantly reduce the costs of cryogenic systems that cool the HTS conductor. This is a fundamental advance in wire technology; however, to date, only short HTS conductor samples have been fabricated at high performance levels. Contributing to this challenge is that, in the field of HTS conductors for power applications, the superconducting materials must be biaxially textured to assure large critical current densities.

An ion-beam-assisted deposition (IBAD) process is one method presently used to form HTS conductors. In an IBAD system, a biaxial texture is imparted to a template layer, for example, yttrium stabilized zirconium (YSZ) or magnesium oxide (MgO) that is formed on a tape substrate.

In an IBAD system, a coating is deposited on a substrate from a plume generated from a deposition source, while at the same time, an ion beam bombards the coating to impart a preferred characteristic to the deposited material. Traditionally, in an IBAD system used for an HTS conductor, an ion beam sputtering source has been used to generate the plume. A major disadvantage of such an IBAD system used for manufacturing an HTS conductor is that the size of available ion beam sputter sources are limited to about 0.6 m. In order to manufacture a conductor having lengths exceeding meters, kilometers, and even hundreds of kilometers, long production runs would be needed. Another disadvantage with using an ion beam sputtering system is that deposition rates are limited to about 1 angstrom per second (Å/s). Solving the problem of the small deposition zone and low deposition rates would remove the obstacle of slow throughput to lower costs with increased throughputs.

An alternative might be an IBAD system relying on an electron beam (e-beam) to vaporize an evaporant material; however, this solution is limited to short production runs. One of the components that limits longer production runs is the source of the e-beam, specifically the thermionic filament, which emits the thermal electrons that are accelerated into the beam. Like a filament in a common light bulb, thermionic filament has a finite lifetime. The lifetime is especially limited in an environment with gasses such as, for example, oxygen, that oxidize or corrode the filament. Solving the problem of that finite lifetime without shutting down production would remove one obstacle to continuous production runs of a week or more.

Thus, there remains a need for a new and improved tape-manufacturing system that has increased production throughput, while at the same time is capable of continuously coating the surface of long tape substrates with a minimum of interruptions.

BRIEF SUMMARY OF INVENTION

The present invention meets these and other needs by providing a tape-manufacturing system for coating at least one tape substrate such as, for example, for the manufacture of a high-temperature superconductor (HTS) conductor. The tape-manufacturing system includes at least two electron beam (e-beam) deposition sources, at least one assist source and, optionally, a controller. Each e-beam deposition source may be in-process repairable. Each e-beam deposition source is capable of communicating an evaporant material with at least a portion of at least one tape substrate to deposit a coating thereon. The at least one assist source is capable of communicating a beam of a species to the coating. The controller communicates with the at least two e-beam deposition sources and the at least one assist source.

An embodiment of the present concerns an in-process repairable e-beam deposition source. This is particularly advantageous when used in a tape-manufacturing system for coating elongated substrates as the in-process repairable e-beam deposition source permits creating coatings having integrity over the lengths required to make, for example, HTS conductor practicable, as well as maintaining the integrity on such lengths economically. To that end, the e-beam deposition source may be self-contained so as to be isolatable from the tape-manufacturing system. In this manner, the integrity of a tape substrate that is being processed in the tape-manufacturing system can be maintained, while at the same time, the e-beam deposition source is repaired.

An isolation mechanism may be provided for isolating an e-beam deposition source from the tape-manufacturing system. For example, an auxiliary chamber communicating with the tape-manufacturing system may be used to accommodate the in-process reparability of an e-beam deposition source. Such auxiliary chamber is evacuatable. The isolation mechanism may further including a closeable passage communicating with an atmosphere external to the tape-manufacturing system. The closeable passage is capable of a vacuum tight seal such as, for example, a passage able to maintain a pressure of at least about 1 torr. In this manner, an e-beam deposition source is interchangeable, thereby making the deposition source in-process repairable. Further, the auxiliary chamber may include a retractor capable of moving an e-beam deposition source into the tape-manufacturing system from the auxiliary chamber and back out of the tape-manufacturing system.

Alternatively, the self-contained e-beam deposition source may further include a redundant filament structure. Again, it may be desirable to provide an isolation mechanism for isolating an e-beam deposition source from the tape-manufacturing system. The filament structure includes at least two filaments and may include up to six filaments. Applicant believes that a redundant filament structure including four filaments would work effectively. The self-contained e-beam deposition source may further include a filament alignment mechanism for aligning an emitting portion of the filament structure with a directing structure of the e-beam deposition source. Such filament alignment mechanism may be particularly beneficial when replacing a spent filament with a replacement filament.

Further, the filament structure may include a filament state monitoring structure and, optionally, a filament switching mechanism. In one aspect, the filament state monitoring structure monitors a resistance of an operational filament. For example, the resistance of the operational filament may be monitored by monitoring a current passing through (e.g., using an ampere meter) and a voltage across (e.g., using a volt meter) the operational filament. The monitored resistance is the steady-state operational resistance of the operational filament.

When included, the filament switching mechanism is triggered by a change in the resistance of an operational filament. For example, the switching mechanism may trigger when the resistance of the operational filament is about 120% of an initial steady-state operational resistance of an operational filament. Alternatively, the switching mechanism may trigger when there is substantially no change in evaporant material flux with an increase in power provided to an operational filament.

As noted, the tape-manufacturing system may include a controller that communicates with the at least two e-beam deposition sources and the at least one assist source. The tape-manufacturing system may further include at least one sensor in communication with the controller. Examples of the at least one sensor includes any one of a flow meter, a species monitor (e.g., an ion current monitor [e.g., a Faraday cup]), a filament state monitor, a deposition sensor, a temperature sensor, a pressure sensor, a vacuum sensor, a speed monitor, and combinations thereof. The controller at least regulates the at least two e-beam deposition sources. Also, the controller may regulate the at least one assist source. In addition, the controller may regulate a translational speed of the tape substrate by communicating with a translation mechanism for moving the at least one tape substrate when included with the tape-manufacturing system.

To make the tape-manufacturing system effective for coating tape substrates, the at least two e-beam deposition sources are spaced so as to create a substantially flat evaporant material flux profile at the surface of the tape substrate. In this manner, the area of the deposition zone is increased so as to accommodate a greater portion of the tape substrate. In turn, the evaporant material flux profile at the surface of the tape substrate is matched to a species density profile of the assist source at the surface of the tape substrate. Such a matching is preferred to achieve a uniformly good texture in the coatings in the increased area of the deposition zone. Applicant believes that an evaporant material profile exhibiting an about 10% variation in evaporant material flux along the length of the deposition zone to be acceptable.

In an aspect, the at least two e-beam deposition sources are arranged serially so as to create an elongated coating deposition zone along a length of the tape substrate. Such an elongated coating deposition zone is at least about 0.6 meters (m) long and may be up to about 5 m long. Applicant believes that an elongated coating deposition zone between about 0.6 to about 1.2 m to be acceptable. A plurality of e-beam deposition sources may be arranged serially so as to create the elongated coating deposition zone along a length of the tape substrate described.

In another aspect, a plurality of e-beam deposition sources may be used to not only elongate the deposition zone, but also to widen the zone. To that end, at least two of the plurality of e-beam deposition sources may be arranged serially so as to create an elongated coating deposition, and at least two other of the plurality of e-beam deposition sources may be arranged parallelly to the at least two so as to create a widened elongated coating deposition zone substantially along to a length of the tape substrate. Such widened elongated coating deposition zone is at least about 8 centimeters (cm) wide and may be up to about 40 cm wide. Applicant believes that a widened elongated coating deposition zone between about 8 and about 20 cm wide is acceptable.

Again, when using a plurality of e-beam deposition sources, they are spaced with respect to each other so as to create a substantially flat evaporant material flux profile. Also, the evaporant material flux profile at the surface of the tape substrate is matched to a species density profile from the assist source at the surface of the tape substrate. As noted above, Applicant believes that an evaporant material profile exhibiting an about 10% variation in the evaporant material flux along the width of the deposition zone to be acceptable.

In the tape-manufacturing system of the present invention, a deposition rate of the evaporant material is at least greater than about 1 angstrom per second (Å/s) and may be up to about 50 Å/s. Applicant believes that a deposition rate of the evaporant material greater than about 1 Å/s and up to about 30 Å/s is acceptable.

In an embodiment, the tape-manufacturing system includes at least two assist sources, each being capable of providing a beam of a species to the coating. As with the e-beam sources, the at least two assist sources may be arrange parallelly, serially and, when a plurality are used, parallelly and serially. When arranged parallelly, the assist sources are spaced so that a species density profile of the assist source at the surface of the tape substrate matches an evaporant material flux profile of the at least two e-beam deposition sources at the surface of the tape substrate so as to effect a change to the coating. With parallelly arranged assist sources, it may be desirable to further include a spacer juxtaposed with respect to the assist sources, so as to minimize or prevent an overlap of the beam of species provided from one assist source with the beam of species provided from another assist source at the surface of the tape substrate. The at least two parallelly arranged assist sources may possess mirror symmetry with respect to a longitudinal axis of the at least one tape substrate being coated.

An assist source is juxtaposed with respect to a surface of the least one tape substrate so that the incident beam of species induces a change in the coating. For example, the incident beam of species may induce the formation of a textured coating on the at least one tape substrate. Alternatively, the incident beam of species may induce the formation of a biaxially textured coating on the at least one tape substrate. In the manufacture of a buffer layer coated tape substrate that is to be coated with a HTS material to create a HTS conductor, an incident angle of the beam of species with respect to a surface of the least one tape substrate is between about 30 to about 50 degrees to create a biaxially buffer layer.

As noted, the at least two assist sources may be arranged serially so that a species density profile of the assist source at the surface of the tape substrate matches an evaporant material flux profile of the at least two e-beam deposition sources at the surface of the tape substrate. The serially arranged assist sources are spaced so as to create a substantially flat species density profile at the surface of the tape substrate.

One example of an assist source is an ion source. A further specific example of an ion source is a radio frequency ion source. Further, an assist source may include a collimating grid positioned in spaced relationship to an exit grid of the assist source within the beam of species of the assist source so as to collimate species beamlets.

At least one assist source is juxtaposed with respect to a surface of the at least one tape substrate so that the bombardment of the coating with the beam of species induces the formation of a biaxially textured coating on the at least one tape substrate. As noted, an incident angle of the beam of species with respect to a surface of the least one tape substrate is between about 30 and 50 degrees.

A tape-manufacturing system of the present invention may be capable of contemporaneously coating a plurality of sequential portions of at least one tape substrate. In addition or alternatively, a tape-manufacturing system of the present invention may be capable of contemporaneously coating at least a portion of a plurality of tape substrates.

Accordingly, one aspect of the present invention is to provide a tape-manufacturing system for coating at least one tape substrate. The tape-manufacturing system includes at least two e-beam deposition sources and at least one assist source. Each e-beam deposition source is capable of communicating an evaporant material with at least a portion of at least one tape substrate to deposit a coating thereon. The at least one assist source is capable of communicating a beam of a species to the coating.

Another aspect of the present invention is to provide an in-process repairable e-beam deposition source useable in a high-temperature superconductor (HTS) conductor tape-manufacturing system including at least two e-beam deposition sources capable of communicating an evaporant material with at least a portion of at least one tape substrate to deposit a coating thereon and at least one assist source capable of contemporaneously communicating a beam of a species to the coating.

Still another aspect of the present invention is to provide a tape-manufacturing system for coating at least one tape substrate such as, for example, for the manufacture of an HTS conductor. The tape-manufacturing system includes at least two electron beam (e-beam) deposition sources, at least one assist source, and a controller. Each e-beam deposition source may be in-process repairable. Each e-beam deposition source is capable of communicating an evaporant material with at least a portion of at least one tape substrate to deposit a coating thereon. The at least one assist source is capable of communicating a beam of a species to the coating. The controller communicates with the at least two e-beam deposition sources and the at least one assist source.

These and other aspects, advantages, and salient features of the present invention will become apparent from the following detailed description, the accompanying drawings, and the appended claims.

BRIEF DESCRIPTION OF DRAWINGS

FIG. 1A is an isometric schematic of a detail of a portion of FIG. 1;

FIGS. 3A and 3B are a cross-sectional schematic of an in-process repairable e-beam deposition source useable in the tape-manufacturing system of FIGS. 1 and 2;

DETAILED DESCRIPTION

Figure 1:
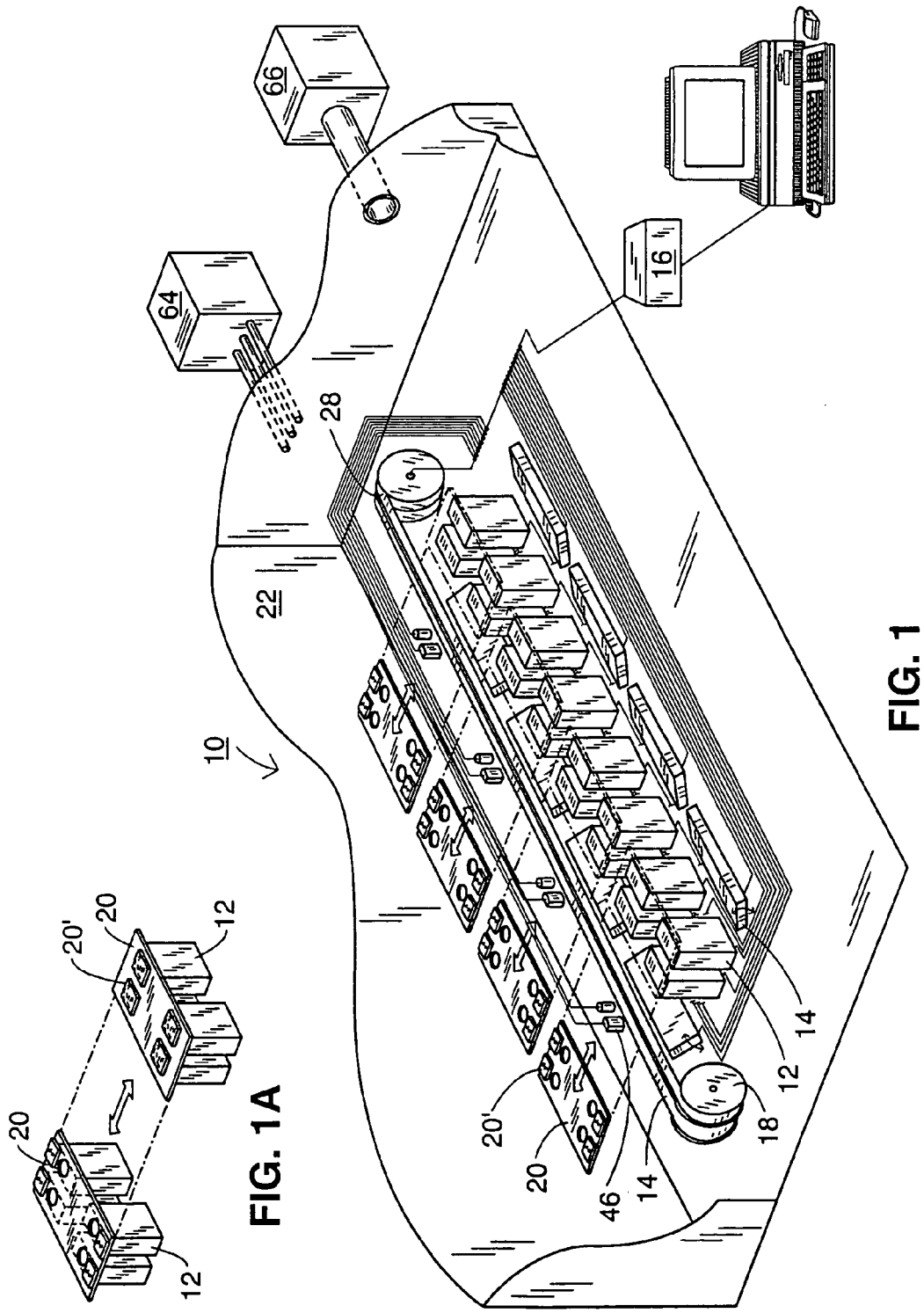
FIG. 1 is an isometric schematic of a tape-manufacturing system according to the present invention.

In the following description, like reference characters designate like or corresponding parts throughout the several views shown in the figures. It is also understood that terms such as "top," "bottom," "outward," "inward," and the like are words of convenience and are not to be construed as limiting terms.

Figure 2:
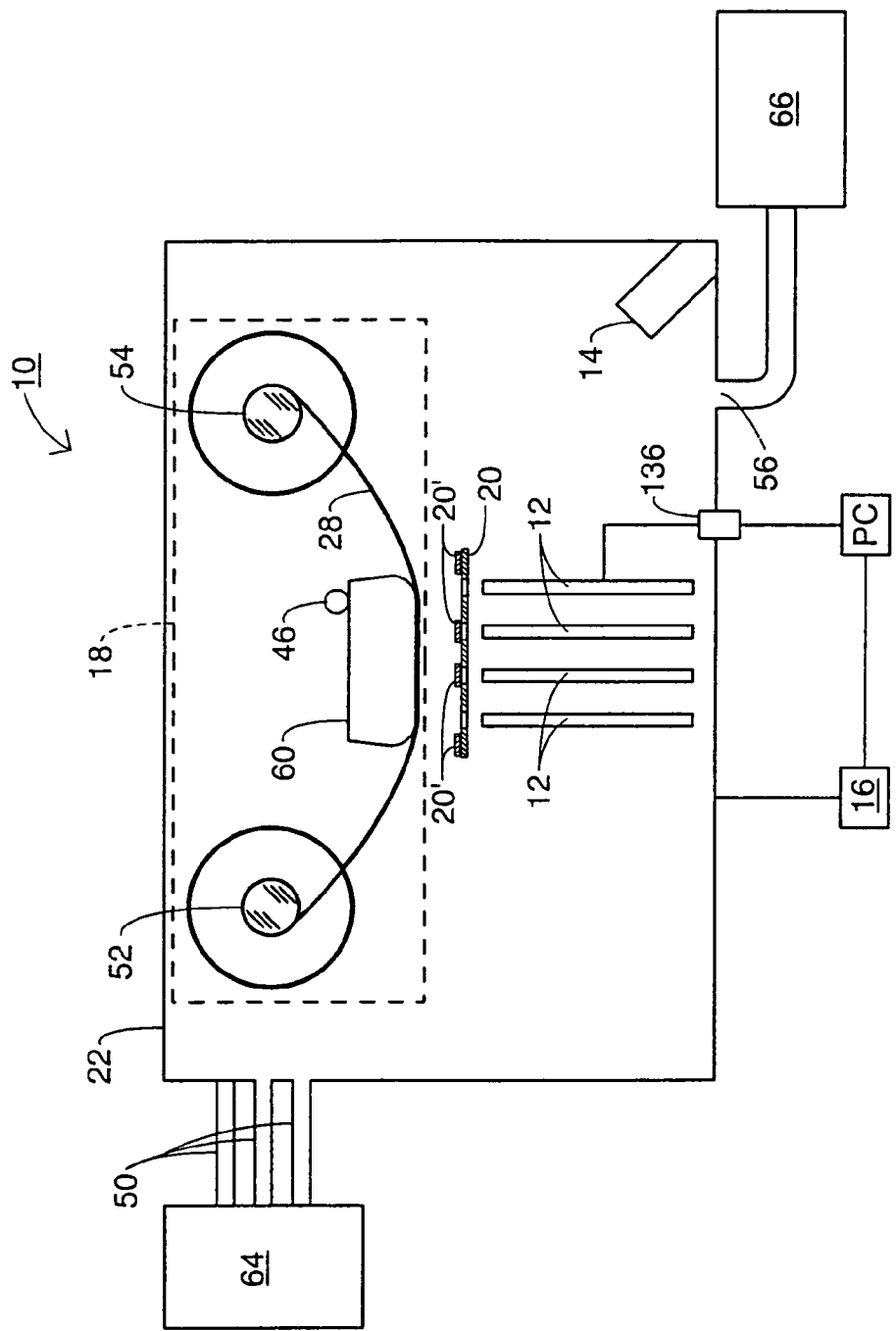
FIG. 2 is a cross-sectional schematic of a tape-manufacturing system according to the present invention.

Referring to the drawings in general and to FIGS. 1 and 2 in particular, it will be understood that the illustrations are for the purpose of describing preferred embodiments of the invention and are not intended to limit the invention thereto. In FIG. 1, an isometric schematic of a tape-manufacturing system 10 according to the present invention is depicted. In FIG. 2, a cross-sectional schematic of a tape-manufacturing system 10 according to the present invention is depicted.

Referring now to FIGS. 1 and 2, the tape-manufacturing system 10 is capable of coating an elongate substrate or tape substrate 28 having greater lengths in less time, while at the same time facilitating the coating integrity over these greater lengths. The tape-manufacturing system 10 includes a plurality of e-beam deposition sources 12, one or more assist sources 14, a controller 16, and a tape translation mechanism 18, all of which may communicate with one another and a tape substrate 28 within an evacuable chamber 22. For example, the plurality of e-beam deposition sources 12 are capable of communicating an evaporant material with the surface of a tape substrate 28 to form a coating and the one or more assist sources 14 are capable of communicating with a beam of a species with the coating. Other elements depicted in FIG. 1 include a plurality of isolation mechanisms 20 and a plurality of sensors 46, all of which communicate with the controller 16 and, optionally, a personal computer (PC).

FIGS. 1 and 2 generally depict an arrangement for a plurality of e-beam deposition sources 12 and one or more of assist sources 14. The plurality of e-beam deposition sources 12 and the one or more assist sources 14 are arranged in a manner so that their cooperation results in the formation of a coating on at least a portion of at least one tape substrate 28 within a deposition zone of the tape-manufacturing system 10. The portion of the tape substrate 28 being coated may be stationary within the deposition zone; however, translating the portion through the deposition zone provides increased throughput. Additional increases in throughput may be achieved by using an appropriate translating mechanism 18 that accommodates the coating a plurality of portions of a tape substrate 28, for example, sequentially, to build up a coating to a desired thickness in the manner described in commonly owned U.S. application Ser. No. 10/609,065 filed Jun. 26, 2003, entitled Apparatus for Consecutive Deposition of High-Temperature Superconducting (HTS) Buffer Layers, the subject matter of which is herein incorporated by reference in its entirety. Alternatively, a translating mechanism 18 that accommodates a plurality of tape substrates 28 may be used simultaneously to coat portions of the plurality of tape substrates 28. FIG. 1 depicts portions of two tape substrates 28 in the deposition zone; however, Applicant contemplates that anywhere from 1 to 24 tape substrates 28 may be accommodated. In the case that one tape substrate 28 is being coated, such tape substrate 28 may be presented to the deposition zone in a manner so that anywhere from 1 to 24 portions of the tape substrate 28 are being coated.

Referring again to the FIGS. 1 and 2, the plurality of e-beam deposition sources 12 are spaced in a manner such as to create a substantially flat evaporant material flux profile within the deposition zone. Each e-beam deposition source 12 has an evaporant material flux profile that is cosinusoidal in nature. That is, the evaporant material flux profile is at a maximum in the center and wanes toward zero as one moves from the center. Thus, adjacent e-beam deposition sources 12 are spaced such that the waning portions of the evaporant material flux profiles are superimposed to create a superimposed evaporant material flux substantially the same as the center evaporant material flux, thereby creating a substantially flat evaporant material flux profile. Applicant believes that a variation of about 10% along the flat evaporant material flux profile to be appropriate substantially flat evaporant material flux profile. In addition, the assist sources 14 are arranged in a like manner to create a species density profile that is substantially flat. To accomplish such profiles, sensors 46, as shown in FIG. 1, may be traced within the deposition zone of the tape-manufacturing system 10 in the manner described in commonly owned U.S. patent application Ser. No. 10/609,250 filed Jun. 26, 2003, entitled Apparatus For and Method of Continuous HTS Tape Buffer Layer Deposition Using Large Scale Ion Beam Assisted Deposition, and U.S. patent application Ser. No. 10/609,236 filed Jun. 26, 2003, entitled Apparatus For and Method of Cooling and Positioning a Translating Substrate Tape for Use With a Continuous Vapor Deposition Process, the subject matter of each is herein incorporated by reference in its entirety.

Each of the plurality of e-beam deposition sources 12 may be, for example, a commercially available rod-fed deposition source such as a Temescal SRIH-270-2RR rod-fed deposition source available from BOC Coating Technology Fairfield, Calif. To achieve an elongated coating deposition zone, at least two deposition sources 12 are arranged serially so as to be aligned substantially with the longitudinal length of tape substrate 28 to be coated. For example, serially arranged e-beam deposition sources 12 are capable of communicating evaporant material to either longitudinally adjacent surface portions of a tape substrate 28 or surface portions of longitudinally adjacent tape substrates 28. By way of example, two SRIH-series e-beam deposition sources 12 may be used to create a deposition zone having a length of about 0.16 meter (m); however, it would be desirable to create a deposition zone length of at least 0.6 m that involves using about seven SRIH-series e-beam deposition sources 12. In trying to create a deposition zone length of about 5 m about 62 SRIH-series e-beam deposition sources 12 would be used. For a deposition zone length ranging from about 0.6 m to about 1.2 m, between about 7 to about 15 SRIH-series e-beam deposition sources 12 could be used.

Likewise, as shown in FIG. 1, deposition sources 12 may be parallelly arranged to increase the deposition zone width. For example, parallelly arranged e-beam deposition sources 12 are capable of communicating evaporant material to either transversely adjacent surface portions of a tape substrate 28 or surface portions of transversely adjacent tape substrates 28. While a deposition zone width of at least about 8 centimeters may obtained in a single row arrangement of SRIH series e-beam deposition sources 12, an about 40 centimeters deposition zone width would use about a two-row arrangement of SRIH-series e-beam deposition sources 12. For a deposition zone width ranging from about 8 to about 20 centimeters (cm), between about 1 to 2 arrangements of SRIH-series e-beam deposition sources 12 could be used. As noted, when increasing the deposition zone length and width, the e-beam deposition sources 12 would be spaced in a manner to create a substantially flat deposition profile. Although regular rows and columns of e-beam deposition sources 12 are depicted in FIG. 1, it will be appreciated that any of a variety of patterns or arrangements might be used to accomplish a substantially flat evaporant material flux profile.

An assist source 14 may be, for example, a commercially available radio frequency linear (RFL) ion beam source with 6 cm×66 cm beam available from Veeco Instruments Inc., Fort Collins, Colo. U.S. Pat. No. 6,225,717 B1 teaches a type of assist source 14 that may be used in the present invention. The disclosure of U.S. Pat. No. 6,225,747 B1 is herein incorporated in its entirety. An assist source 14 may include a collimating grid 44 positioned in a spaced relationship to an exit grid of the assist source 14 within the beam of species of the assist source so as to collimate species beamlets. To achieve an elongated coating deposition zone, at least one assist source 14 is arranged along the longitudinal length of tape substrate 28 to be coated. For example, one RFL ion beam source may be used to treat a deposition zone having a length of at least 0.6 meters (m). In treating a deposition zone length of about 5 meters, about 7 or 8 serially arranged RFL ion beam sources could be used. For a deposition zone length ranging from about 0.6 meters to about 1.2 meters, about two serially arranged RFL ion beam sources could be used. The serially arranged assist sources are spaced so as to create a substantially flat species density profile at the surface of the tape substrate. When using ion beam sources as the assist source 14, the species density profile is the ion current density profile.

Likewise, a plurality of assist sources 14 could be arranged in parallel to increase the deposition zone width. While a deposition zone width of at least about 8 centimeters may use a single RFL ion beam source, an about 40 centimeters deposition zone width would use a two-row parallel arrangement of the RFL ion beam source. For a deposition zone width ranging from about 8 to about 20 centimeters, between about a 1 to 2 row arrangement of the RFL ion beam source could be used. With parallelly arranged assist sources 14, it may be desirable to further include a spacer juxtaposed with respect to the assist sources so as to minimize an overlap at the surface of the tape substrate 28 of the beam of species provided from one assist source with the beam of species provided from another assist source. Although regular rows and columns of assist sources 14 are depicted in FIG. 1, it will be appreciated that a variety of patterns or arrangements might be used to create a desired texture in a coating. For example, two parallelly arranged assist sources 14 may possess mirror symmetry with respect to a longitudinal axis of the at least one tape substrate 28 being coated.

The tape-manufacturing system 10 may be used to produce any of a non-textured coating, partially textured coating, highly textured coating, and combinations thereof. The tape-manufacturing system 10 is capable of producing a biaxially textured coating. An assist source is juxtaposed with respect to a surface of the least one tape substrate so that the incident beam of species induces the formation of a texture and, more particularly, a biaxial texture in the coating on at least one tape substrate. In the manufacture of a buffer layer thin film on a metal substrate tape for the eventual manufacture of an HTS conductor an incident angle of the beam of species with respect to a surface of tape substrate 28 is between about 30 and 50 degrees. Such a coating is used as a template in the formation of HTS materials in the manufacture of HTS conductors. It is anticipated that such HTS conductors will be used to replace copper cabling in high-density power areas to further increase power density. For example, in large cities where the conduits and wiring are limited, replacing the wiring with superconductor lines or wiring will allow increasing power density.

For the tape-manufacturing system 10 of the present invention, it is desirable that a deposition rate of the evaporant material be greater than about 1 Å/s and even up to about 50 Å/s. Applicant believes that a deposition rate of the evaporant material of greater than about 1 Å/s to up about 30 Å/s would be acceptable.

The translation mechanism 18 in FIG. 1 provides a plurality of tape substrates 28 to the deposition zone of the tape-manufacturing system 10. The translation mechanism 18 may be any of a variety of mechanisms. Examples of various translation mechanisms 18 include reel-to-reel units, conveyors, as well as robotic translators.

The controller 16 is a commercially available controller with a plurality of inputs and outputs that meet the requirements of the peripherals. The controller 16 may be a microcontroller or a PC with appropriate hardware and software. Details concerning controllers that may be used in tape-manufacturing system 10 are discussed in, for example, U.S. Pat. Nos. 5,980,078; 5,726,912; 5,689,415; 5,579,218; 5,351, 200; 4,916,600; 4,646,223; 4,344,127; and 4,396,976, the entire disclosure of each being incorporated by reference herein. The vacuum pump is a commercially available vacuum pump capable of maintaining a vacuum of pressure in the order of magnitude of $10^{-7}$ torr. One example of such a pump is an APD Cryogenics, Marathon 16 cryopump.

Other elements of the tape-manufacturing system 10 depicted in FIG. 2 include an isolation mechanisms 20 (see also, e.g., FIG. 1A), a sensor 46, a plurality of gas input lines 50, a feeder spool 52 and a take-up spool 54 (both part of the tape translation mechanism 18), a vacuum port 56, and a substrate block 60, all of which may communicate with the controller 16. Features of the tape-manufacturing system 10 not depicted, yet understood to be part of the tape-manufacturing system 10, include a variety of mechanical, electrical, and electromechanical connectors, a gas delivery system including the appropriate instruments, fittings, and connectors, and a vacuum pump system or systems including the appropriate instruments, fittings, and connectors.

The cross-sectional schematic of a tape-manufacturing system 10 depicted in FIG. 2 shows a tape substrate 28 present by a tape translation mechanism 18 to a deposition zone generated by four serially arranged e-beam deposition sources 12. A coating formed on the tape substrate 28 may be subjected to an incident beam of species from an assist source 14. The tape substrate 28, the tape translation mechanism 18, the serially arranged e-beam deposition sources 12 and the assist source 14 are depicted as being within an evacuable chamber 22. As noted above, it is not necessary that that these components be within an evacuable chamber 22; rather, it may be sufficient that the elements or their effects communicate with the evacuable chamber 22. The evacuable chamber 22 of FIG. 2 also includes a plurality of gas input lines 50, a vacuum port 56, and a connector 136. Depicted external to the evacuable chamber 22 is a controller 16 PC, a gas delivery system 64, and a vacuum pump system 66.

In FIG. 2, the tape translation mechanism 18 is shown presenting a continuous length of tape substrate 28. The tape translation mechanism 18 also includes a feeder spool 52, a substrate block 60, sensor 46 (e.g., a film thickness monitor), and a take-up spool 54. The tape substrate 28 unwinds feeder spool 52. The diameter and width of the feeder spool 52 may vary with the dimensions of the tape substrate 28. The feeder spool 52 may be constructed from any of a variety of materials capable of withstanding processing conditions in the evacuable chamber 22. The take-up spool 54 is constructed to be compatible with the feeder spool 52 and processing conditions in the evacuable chamber 22. The tape substrate 28 winds onto the take-up spool 54. The substrate block 60, which functions as a heat sink to tape substrate 28, in constructed using any of a variety of appropriate materials such as, for example, copper or copper alloys. The substrate block 60 is positioned in the evacuable chamber 22 to be within the deposition zone generated by the serially arranged e-beam deposition sources 12 and to maintain the surface of tape substrate 28 within the deposition zone. Sensor 46 may be any of a variety that assists with the manufacture of the coating. One example of such sensors is a deposition rate monitor such as, for example, a quartz crystal or an optical monitor.

The tape translation mechanism 18 may allow for the bi-directional translation of the tape substrate 28, enabling the tape substrate 28 to translate back through the deposition zone generated by the e-beam deposition sources 12 and the incident beam of species provided by the assist source 14. The bi-directional translating capability of the tape translation mechanism 18 enables the tape substrate 28 to translate back through the deposition zone any number of times, allowing the optimum thin film thickness to be deposited thereon.

The evacuable chamber 22 is constructed of materials with the capability of maintaining a vacuum to the order of $10^{-7}$ Torr. Such materials may include stainless steel alloys, carbon steel alloys, aluminum alloys, INCONEL® alloys, copper alloys and exotic alloys. Also, it would be desirable that evacuable chamber 22 be pressurizeable to the order of about 2 atmospheres. Further, it would be desirable that evacuable chamber 22 be capable of withstanding corrosive and/or oxidizing environments. Thus, evacuable chamber 22 is constructed of any one of a stainless steel alloy such as 304 or 316L stainless steel, an INCONEL® alloy or any other appropriate exotic alloy. Also evacuable chamber 22 includes all of the appropriate gaskets, seals, feedthroughs, and seal plates to be capable of maintaining a vacuum to the order of $10^{-7}$ torr and being pressurized to the order of about 2 atmospheres. A commercial supplier of chambers and accessories that Applicant believes to be suitable for use as an evacuable chamber 22 is Thermionics Vacuum Products, Port Townsend, Wash., USA.

A gas delivery system 64 delivers gas through gas input lines 50 as may be appropriate during coating and at the appropriate time to pressurize the evacuable chamber 22. A vacuum pump system 66 communicating with vacuum port 56 provides the means for evacuating evacuable chamber 22.

The tape substrate 28 is a metal tape formed from any of a variety of materials capable of withstanding temperatures up to about 900° C. Examples of such materials are stainless steel alloys; nickel alloys such as INCONEL® alloys; and biaxially textured metal tape such as that disclosed in U.S. Pat. Nos. 6,610,414; 6,610,413; 6,607,839; 6,607,838; 6,602,313; 6,599,346; 6,451,450; 6,447,714; 6,331,199; 6,106,615; 5,964,966; 5,958,599; 5,898,020; 5,741,377 and 5,739,086 by Goyal et al. and U.S. Pat. Nos. 6,562,761; 6,475,311; 6,458,223; 6,426,320; 6,027,564; and 6,022,832 by Fritzemeier et al. (the disclosure of each being hereby incorporated by reference in their entirety). The dimensions of the tape substrate 28 may vary to meet the desired finished product and system limitations. For example, the tape substrate 28 may have a thickness of 25 to 125 microns (μm), a width of between about 3 millimeters (mm) to 40 centimeters (cm), and a length of upwards of several hundred meters. As noted, a plurality of tapes, e.g., between 3 and 24, may translate together through the tape-manufacturing system 10 and receive uniformly deposited coatings.

An isolation mechanism 20 is positioned between the e-beam deposition sources 12 and the tape substrate 28, for example, before the substrate block 60. The isolation mechanism 20 may be a protective ceramic member containing a plurality of apertures disposed in an arrangement to enable the line of sight of an e-beam deposition source 12 to its corresponding deposition sub-zones to be blocked.

As tape-manufacturing system 10 performs continuous operation for upwards of 100 hours, design considerations are included that prevent non-uniform thin film layer deposition in the case of failure of any of the e-beam deposition sources 12. An element that is likely to fail under the strain of continuous operation is the filament contained within each electron gun included within each of the e-beam deposition sources 12. The tape-manufacturing system 10 continues a uniform deposition process as follows: when one of the e-beam deposition sources 12 fails, for whatever reason, the isolation mechanism 20 halts deposition in the deposition sub-zone defined by the failed e-beam deposition source 12 by closing a shutter 20' included within the isolation mechanism 20 corresponding with failed sub-zone. The controller 16 is triggered by the closing action of the isolation mechanism 20 to reduce the translational velocity of the tape substrate 28 by a proportional amount. For example, if there are four e-beam deposition sources 12 as shown in FIG. 2 and one fails, the translational velocity of the tape substrate 28 may be reduced by 25%. Also, that portion of the tape substrates 28 that are exposed to the failed e-beam deposition source 12 should be covered by a shutter 20' so that the portion is not bombarded by the assist source 14. The controller 16 communicates a failure message containing information regarding which of the e-beam deposition sources 12 has failed, and a technician may take the necessary steps to bring the failed e-beam deposition sources 12 back into operation. Once the failed e-beam deposition source 12 is back online, the controller 16 increases the translational velocity of the tape substrate 28 back to a normal value. Also the shutter 20' that covered the portion of the tape substrates 28 that would have been exposed to the failed e-beam source 12 is opened.

Referring now to FIGS. 3A and 3B that show a portion of a tape-manufacturing system 10, including an e-beam deposition source 12 that is retractable so as to be in-process repairable. The e-beam deposition source 12 is provided to the tape-manufacturing system 10 by way of an auxiliary chamber 24. The e-beam deposition source 12 includes the usual components such as, for example, a filament 38 for creating an electron beam 28 to vaporize an evaporant material, provided as an evaporator rod 80 that is a distance "X" 112 such as, for example, between about 0.2 and 1 meter (m) from the tape substrate 28. The auxiliary chamber 24 is in contacting communication with the evacuable chamber 22. Also, the auxiliary chamber 24 includes a retractor 30 for removing the e-beam deposition source 12 from the evacuable chamber 22 to the auxiliary chamber 24 and vice versa through a closeable passage 26.

The closeable passage 26 is capable of interrupting the communication between the auxiliary chamber 24 and evacuable chamber 22 in a manner the permits the vacuum within the evacuable chamber 22 to be maintained so that the deposition process may be continued with any additional e-beam deposition sources 12. Alternately, the closeable passage 26 permits a vacuum within the evacuable chamber 22 and is maintained at a level that prevents any contamination of the tape substrate 28 by an incursion of ambient atmosphere when the deposition operation is interrupted to allow the e-beam deposition source 12 to be repaired. A mechanical vacuum pump 84 provides a means for reestablishing a vacuum in auxiliary chamber 24 to permit the reintroduction of the repaired e-beam deposition source 12 in the evacuable chamber 22 to re-establish the deposition process.

Auxiliary chamber 24 may be a load-lock chamber having the appropriate dimensions so as to be capable of accommodating the dimensions of an e-beam deposition source 12 and to valves, ports, and hardware of the retractor 30. For example, it is believed that a load-lock chamber capable of handling objects of lengths and diameters of at least about 50 cm could accommodate a Temescal SRIH-270-2RR rod-fed deposition source available from BOC Coating Technology Fairfield, Calif., USA. Load-lock chambers of such size may be available from Thermionics Vacuum Products or CEVP Limited, Newhaven, East Sussex, England. Thermionics Vacuum Products and CEVP Limited also supply load-lock chambers fitted with linear guide bar kits. Such linear guide bar may act as the retractor 30 to move the e-beam deposition source 12 from the evacuable chamber 22 to the auxiliary chamber 24 and vice versa, thereby making the e-beam deposition source 12 in-process repairable. A vacuum pump 84 facilitates the evacuation of auxiliary chamber 24 to permit the reintroduction of a serviced e-beam deposition source 12 into evacuable chamber 22.

Figure 4A:
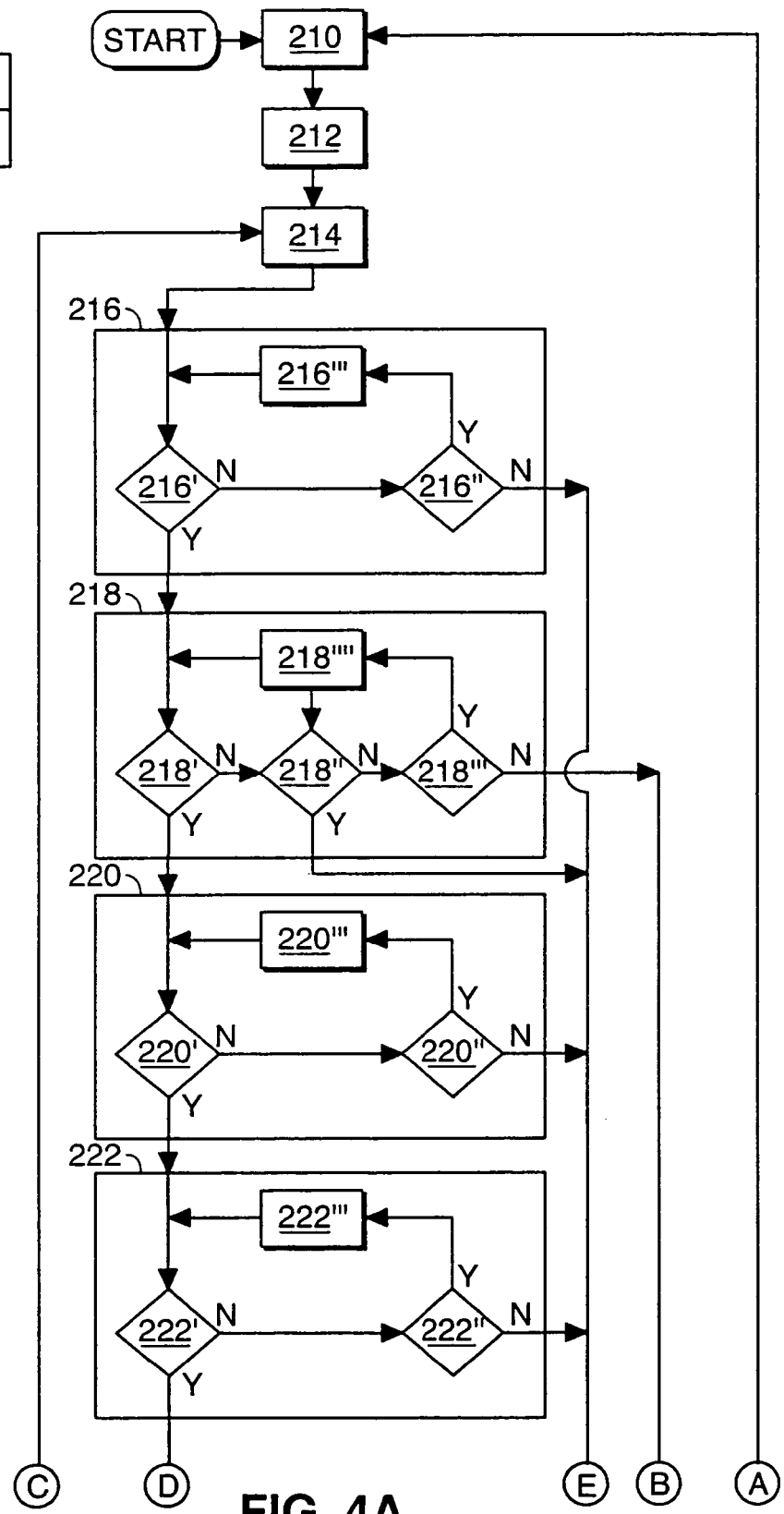
FIGS. 4A and 4B are a decision diagram describing the operation of the in-process repairable e-beam deposition source of FIGS. 3A and 3B.
Figure 4B:
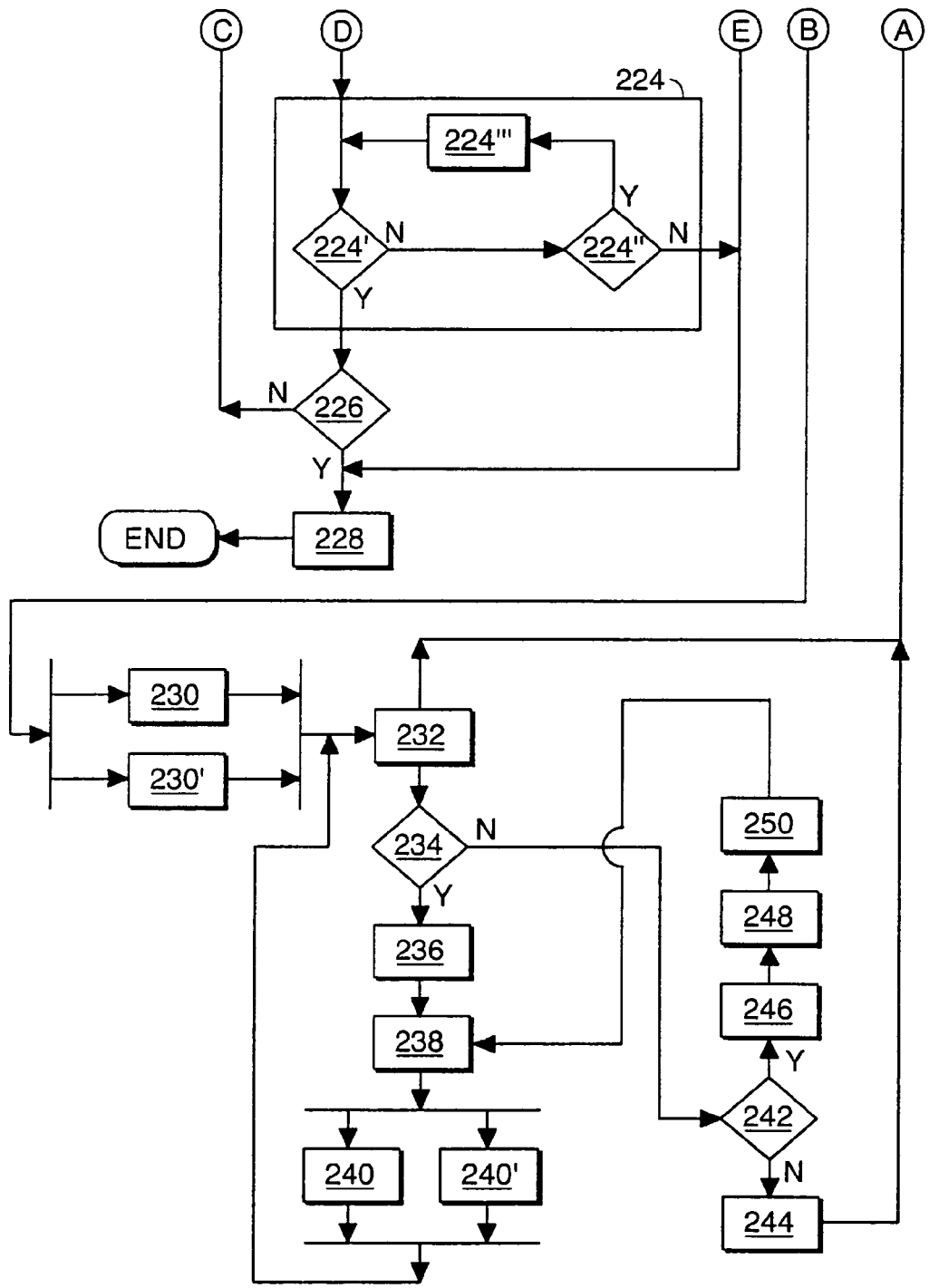

FIGS. 4A and 4B illustrate a method 200 of repairing an e-beam deposition source 12, including the following steps:

Step 210, Set up Manufacturing Process: In this step, the tape-manufacturing system 10 is set up, for example, by:
  (1) calibrating: (a) the evaporant material flux profile from the e-beam deposition sources 12 at locations that correspond to the surface of the tape substrate 28 and (b) the species density profile form the assist source 14 at the surface of the tape substrate 28;
  (2) verifying the operational status of: (a) the gas delivery system 64, (b) the controller 16, (c) the tape translation mechanism 18, (d) the vacuum system 66, (e) the isolation mechanism 20 and (f) the auxiliary chamber 24 including the retractor 30 and/or the redundant filament structure 32; and
  (3) mounting tape substrate 28 on the tape translation mechanism 18 in tape-manufacturing system 10.

Step 212, Start Manufacturing Process: In this step:
  (1) (a) the e-beam deposition sources 12 and the assist source 14 are brought to their steady-state operating conditions;

(2) the steady-state operating characteristics for the filament 38 and the corresponding steady-state evaporant material flux for each e-beam deposition source 12 are noted;

(3) the set points for: (a) the species density from the assist source, (b) the vacuum level for the evacuable chamber 22, (c) the gas flowrates from the gas delivery system 64, and (d) the tape substrate 28 translation speed are noted; and (4) the isolation mechanism 20 is withdrawn to expose the surface of the tape substrate 28 to vaporizing evaporant material of e-beam deposition sources 12 and the tape translation mechanism 18 begins moving the tape substrate 28 through the deposition zone at a predetermined set point translation rate.

Step 214, Monitoring Operating Parameters of Tape-Manufacturing System: In this step, the controller 16 monitors the operating parameters from Step 212.

Step 216, Asset Source Operational: In this step, the controller 16 compares the operating parameters with the set point parameters of the assist source 14. To the extent that the operating parameter can be adjusted to be within the set point value limits for the assist source 14, the tape-manufacturing system 10 continues processing the tape substrate 28. If the assist source 14 is outside of the set point value limits or has failed, the controller 16 switches the tape-manufacturing system 10 to Step 228, Tape-Manufacturing System Shutdown.

Step 218, E-beam Source Operational: In this step, the controller 16 compares the operating parameters with the set point parameters and the steady state operating parameters of each e-beam deposition source 12. To the extent that the operating parameter can be adjusted to be within the set point value limits and/or the steady state value limits for each e-beam deposition source 12, the tape-manufacturing system 10 continues processing the tape substrate 28 at the set point translation rate. If all the e-beam deposition sources 12 have failed, the controller 16 switches the tape-manufacturing system to Step 228, Tape-Manufacturing System Shutdown. If one or more but not all e-beam deposition sources 12 is outside of the set point value limits and/or the steady state value limits or has failed, the controller 16 switches the tape-manufacturing system 10 to Step 230, Isolation of Non-operational E-beam Source and Step 230', Tape Substrate 28 Translation Rate Reduction.

Step 220, Translation Mechanism Operational: In this step, the controller 16 compares the operating parameters with the set point parameters of the tape translation mechanism 18. To the extent that the operating parameter can be adjusted to be within the set point value limits for the tape translation mechanism 18, the tape-manufacturing system 10 continues processing the tape substrate 28. If the tape translation mechanism 18 is outside of the set point value limits or has failed, the controller 16 switches the tape-manufacturing system 10 to Step 228, Tape-Manufacturing System Shutdown.

Step 222, Vacuum System Operational: In this step, the controller 16 compares the operating parameters with the set point parameters of the vacuum system 66. To the extent that the operating parameter can be adjusted to be within the set point value limits for the vacuum system 66, the tape-manufacturing system 10 continues processing the tape substrate 28. If the vacuum system 66 is outside of the set point value limits or has failed, the controller 16 switches the tape-manufacturing system 10 to Step 228, Tape-Manufacturing System Shutdown.

Step 224, Gas Supply System Operational: In this step, the controller 16 compares the operating parameters with the set point parameters of the gas supply system 64. To the extent that the operating parameter can be adjusted to be within the set point value limits for the gas supply system 64, the tape-manufacturing system 10 continues processing the tape substrate 28. If the gas supply system 64 is outside of the set point value limits or has failed, the controller 16 switches the tape-manufacturing system 10 to Step 228, Tape-Manufacturing System Shutdown.

Step 226, Entire Tape Substrate 28 Length Coated: In this step, the controller 16 determines if the entire length of the tape substrate 28 has been coated. If the entire length of the tape substrate 28 has not been coated, the controller 16 repeats Step 214 through Step 224; otherwise, the controller 16 switches the tape-manufacturing system 10 to Step 228, Tape-Manufacturing System Shutdown.

Step 228, Tape-Manufacturing System Shutdown: In this step, the controller 16 shuts down the tape-manufacturing system 10.

Step 230, Isolation of Non-Operational E-beam Source: In this step, the controller 16 instructs the isolation mechanism 20 to isolate any non-operational e-beam sources 12 while shutting them down.

Step 230', Tape Substrate 28 Translation Rate Reduction: In this step, which may be performed substantially simultaneously with Step 230, Isolation of Non-Operational E-beam Source, controller 16 instructs the tape translation mechanism 18 to reduce the set point translation rate to a value proportionate to the ratio of the number of the operational e-beam sources 12 to the number of initially operational e-beam sources 12.

Step 232, Reset Set Point and Operating Parameters of Tape-Manufacturing System: In this step, the operating parameters of Step 214 are reset as appropriate to accommodate any changes that have occurred within tape-manufacturing system 10 so the controller 16 has the correct set point parameters and the steady state operating parameters.

Step 234, Any Redundant Filament In Non-Operational E-beam Source: In this step, controller 16 determines if the non-operational e-beam source 12 has an available redundant filament 38. If there is a redundant filament 38', the controller 16 directs the tape-manufacturing system 10 to Step 236, Switch To Redundant Filament; otherwise, the controller 16 directs the tape-manufacturing system 10 to Step 242, Is Non-Operational E-beam Source Retractable.

Step 236, Switch To Redundant Filament: In this step, controller 16 directs the non-operational e-beam source 12 to switch to the available redundant filament 38.

Step 238, Restart Repaired E-beam Source: In this step, controller 16 restarts the repaired e-beam source 12.

Step 240, Re-engagement of Repaired E-beam Source: In this step, the controller 16 instructs the isolation mechanism 20 to reengage any repaired e-beam sources 12.

Step 240', Tape Substrate 28 Translation Rate Increase: In this step, which may be performed substantially simultaneously with Step 240, Re-engagement of Repaired E-beam Source, controller 16 instructs the tape translation mechanism 18 to increase the set point translation rate to a value proportionate to the ratio of the number of the operational e-beam sources 12 to the number of initially operational e-beam sources 12.

Step 242, Is Non-operational E-beam Source Retractable: In this step, controller 16 determines if the non-operational e-beam source 12 is retractable into an auxiliary chamber 24 to effect repair. If the non-operational e-beam source 12 is retractable, the controller 16 directs the tape-manufacturing system 10 to Step 246, Retract Non-Operational E-beam Source; otherwise, the controller 16 directs the tape-manufacturing system 10 to Step 244, Keep Non-Operational E-beam Source Isolated.

Step 244, Keep Non-Operational E-beam Source Isolated: In this step, controller 16 directs the tape-manufacturing system 10 to keep the non-operational e-beam source 12 isolated.

Step 246, Retract Non-Operational E-beam Source: In this step, controller 16 directs the tape-manufacturing system 10 to retract the non-operational e-beam source 12 into the auxiliary chamber 24 to effect repair.

Step 248, Repair Non-Operational E-beam Source: In this step, an operator repairs the retract of the non-operational e-beam source 12 by either replacing the entire e-beam source 12 or filament 38 or the redundant filament structure 32 as is appropriate.

Step 250, Replace Repaired E-beam Source: In this step, an operator replaces the repaired e-beam source 12 into the evacuable chamber 20 through the auxiliary chamber 24 taking the time to appropriately evacuate the auxiliary chamber 24 prior to communicating with the evacuable chamber 20.

As should be apparent from the discussion of FIGS. 4A and 4B, alternative structure for making an e-beam deposition source 12 online repairable is through the use of a redundant filament structure 32. FIGS. 5, 6, 7, and 8 related to e-beam deposition source 12 including such alternate structure.

Figure 5:
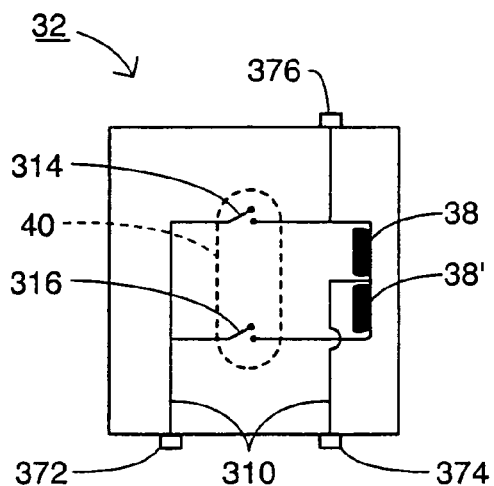
FIG. 5 is a schematic of a redundant filament structure useable in the in-process repairable e-beam deposition source of FIGS. 3A and 3B and the e-beam deposition sources in the tape-manufacturing system of FIGS. 1 and 2.

FIG. 5 is a schematic of a redundant filament structure 32 having a filament 38 and redundant filaments 38'. The redundant filament structure 32 includes two high voltage power supply (HVPS) leads 310, a controller lead 320, two high voltage HVPS connectors 372, 374, a controller connector 376, and a filament switch 40. Filament switch 40 uses switches 314 and 316 to toggle between filament 38 and redundant filaments 38'. HVPS leads 310 are electrical wires capable of carrying the voltages required for the operation of filament 38 and redundant filaments 38. The controller lead 320 is a conductor that is capable of carrying data in either direction. Connectors 372 and 374 are electrical contacts that permit a rapid connecting and disconnecting to a high voltage power supply. Connector 376 permits a rapid connecting and disconnecting to a filament monitor 36 and in turn to a sub-controller of the e-beam deposition source 12 and/or the controller 16 of the tape-manufacturing system 10.

Figure 6:
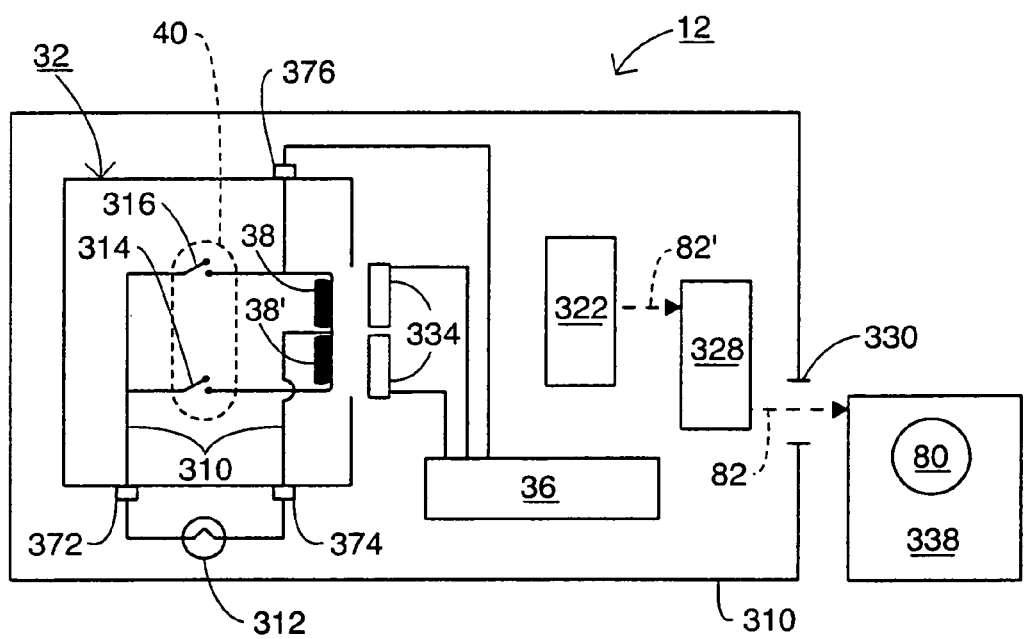
FIG. 6 is a schematic of an in-process repairable e-beam deposition source having a redundant filament usable in the in-process repairable e-beam deposition source of FIGS. 3A and 3B and the e-beam deposition sources in the tape-manufacturing system of FIGS. 1 and 2.

Turning now to FIG. 6, that shows a schematic of the e-beam deposition source 12 that includes the redundant filament structure 32 of FIG. 5. The e-beam deposition source 12 includes an electron gun 310, further including a high-voltage power supply (HVPS) 312, redundant filament structure 32, a beam control unit 322, a filament monitor 36, a series of bending magnets 328, an aperture 330, a pair of shutters 334, and a hearth 338 for presenting a rod 80 of evaporant material for evaporation by an e-beam 80.

The electron gun 310 is a modified version of a commercially available, thermionic electron heating device such as, for example, a Temescal deposition source available from BOC Coating Technology Fairfield, Calif., USA or those available from Thermionics Vacuum Products. The high-voltage power supply (HVPS) 312 is a commercially available, high-voltage DC power supply of about ten kilovolts (kV) and about six kilowatts (kW). The switch 314 and the switch 316 are conventional mechanical or electronic on-off switches. The filament 38 and redundant filaments 38 are metal wires that, when heated by electrical resistance using the high-voltage power supply (HVPS) 312, emit thermal electrons. Tungsten is one common example of the material used in these components.

The beam control unit 322 is a collection of components commonly found in electron guns. Included among these are components that generate an electric field to accelerate the electrons generated off from filament 38 and redundant filaments 38' and focus the e-beam 82' into a single point approximately one centimeter in diameter. The beam control unit 322 also has amplifiers, oscillators, electromagnets, and associated components that move the e-beam 82', through a predetermined pattern (sweep pattern) to sweep the surface of the rod 80 as e-beam 82. The filament monitor 36 is a controller integrated into the electron gun 310, with a plurality of inputs and outputs that meet the requirements for controlling the electron gun 310. The bending magnets 328 are a series of magnets which may be permanent, arranged in such a way that their is field lines direct the e-beam 82' to e-beam 82 and through the aperture 330 in a wall of the electron gun 310 to the appropriate target, in the present case an evaporant material. The shutters 334 are plates of a material capable of blocking the passage of electrons and are interposed in front of the filament 38 and redundant filaments 38 as appropriate. The hearth 338 is a water-cooled copper block for presenting an evaporant material that in the case of manufacturing a HTS conductor may be a solid rod 80 made of materials such as yttrium stabilized zirconium (YSZ) or magnesium oxide (MgO).

The high voltage power supply 312, switch 316 of filament switch 40, and the filament 38 are in an electrical circuit. The high voltage power supply 312, switch 314 of filament switch 40, and the filament 38' are in an alternative electrical circuit. The filament monitor 36 is electrically connected to these circuits and to the high voltage power supply 312, the beam control unit 322, and the shutters 334. The bending magnets 328 exist inside the electron gun 310 in alignment with the e-beam 82'. The aperture 330, through which the e-beam 82 exits, is cut into the body of the electron gun 310. The rod 80 is usually embedded in a crucible that, in turn, is embedded in the hearth 328.

The operation begins with the switch 314 of filament switch 40 closed and the switch 316 of filament switch 40 open. The shutters 334 are initially closed. high voltage power supply 312 is turned on gradually and current flows through the circuit, heating the filament 38 at a predetermined rate, allowing the filament 38 to thermally adjust. When the current in the filament 38 has reached a predetermined amount of around 50-100 microamperes ($\mu A$) and the emission current has reached a predetermined value of the shutter 334 in front of filament 38 is opened and the filament monitor 36 instructs the beam control unit 322 to begin sweeping the e-beam 82 over the surface of the rod 80, evaporating the evaporant material of the rod for deposition onto the tape substrate 28.

In time, the filament 38 begins to deteriorate such as, for example, by erosion and/or oxidation. The filament monitor 36 measures the performance of the filament 38 by, for example measuring the current being supplied to the filament 38 and the voltage drop across the filament 38. From these measurements, the operational resistance may be calculated Simultaneously, the controller 16 receives data from the sensor 46, measuring the vapor deposition rate on the substrate tape 28. As the filament 218 inevitably deteriorates, the electron beam 82 weakens, and the rod 80 melts more slowly, lowering the vapor deposition rate. As this happens, the controller 16 instructs the tape translation mechanism 18 to lower the rate at which the substrate tape 28 unreels from the feeder spool 52. An optimum tape translation velocity is calculated to maintain a constant, correct deposition film thickness on the substrate tape 28.

While the filament 38 is burning and wearing down, the filament monitor 36 measures the current in the filament 38, the voltage drop across and/or the emission current from the filament. When operational resistance filament 38 deviates by a set amount from a predetermined benchmark such as, for example, about 120% of an initial steady-state operational resistance, filament monitor 36 instructs filament switching mechanism 40 to open switch 316 and close switch 314 to commence the operation of redundant filament switch 38'. An alternative trigger for filament monitor 36 to instruct switching mechanism 40 to change to the redundant filament 38' is a determination that there is substantially no change in evaporant material flux as measured by sensor 46 with an increase in power provided to filament 38.

The HVPS leads 310, the switch 312, the switch 314, the filament 38 and redundant filaments 38' are all electrically connected in a circuit. The HVPS leads 310 are electrically connected to the connectors 372 and 374. The controller lead 320 is electrically connected to the connector 376. The controller lead 320 is electrically connected to the circuit, allowing the controller or filament monitor 36 to communicate with the switches 314 and 316. When the redundant filament structure 32 is locked into place such that filament 38 and redundant filaments 38' are aligned with a shutter 334, the connectors 372 and 374 are electrically connected to the HVPS 312 and the connector 376 is electrically connected to controller 16 and filament monitor 36.

In operation, one of the filament structures 32 is mechanically locked into position, such that filament 38 and redundant filaments 38' are aligned with the shutters 334, with the entire e-beam deposition source 12 appearing schematically as in FIG. 6. From here, the operation starts with turning on the HVPS 312 and gradually increasing the current to filament 38. Eventually, the filament 38 begins to fail and the filament 38' takes over. When the filament 38' eventually begins to fail, the filament monitor 36 instructs the filament switch mechanism 40 to open the switch 314 and close the shutter 334 that is in front of the filament 38'. The filament monitor 36 also sends instructions to controller 16 to instruct the isolation mechanism 20 to close the open passageway between the e-beam deposition source 12 and the substrate tape 28.

Redundant filament structure 32 includes at least two filaments 38 and 38'. A redundant filament structure 32 including up to six filaments 38, 38', 38", 38''', 38'''', and 38'''''; however, four filaments 38, 38', 38", and 38''', appear to be a number that would work effectively. Filament structures 32 having four filaments 38, 38', 38", and 38''' are shown in FIGS. 7 and 8.

Figure 7:
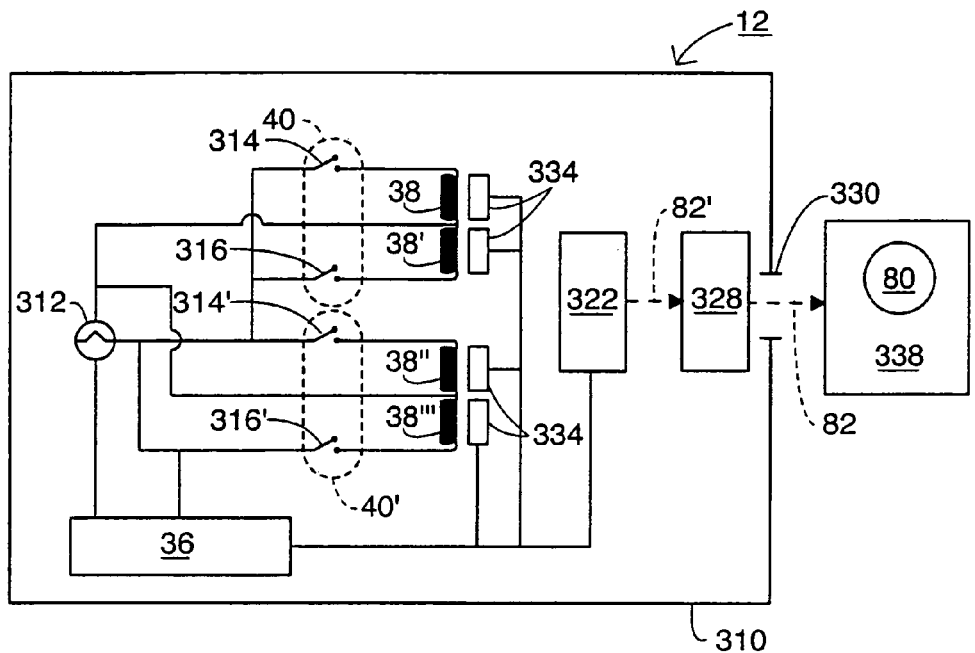
FIG. 7 is a schematic of an in-process repairable e-beam deposition source having a redundant filament usable in the in-process repairable e-beam deposition source of FIGS. 3A and 3B and the e-beam deposition sources in the tape-manufacturing system of FIGS. 1 and 2.
Figure 8:
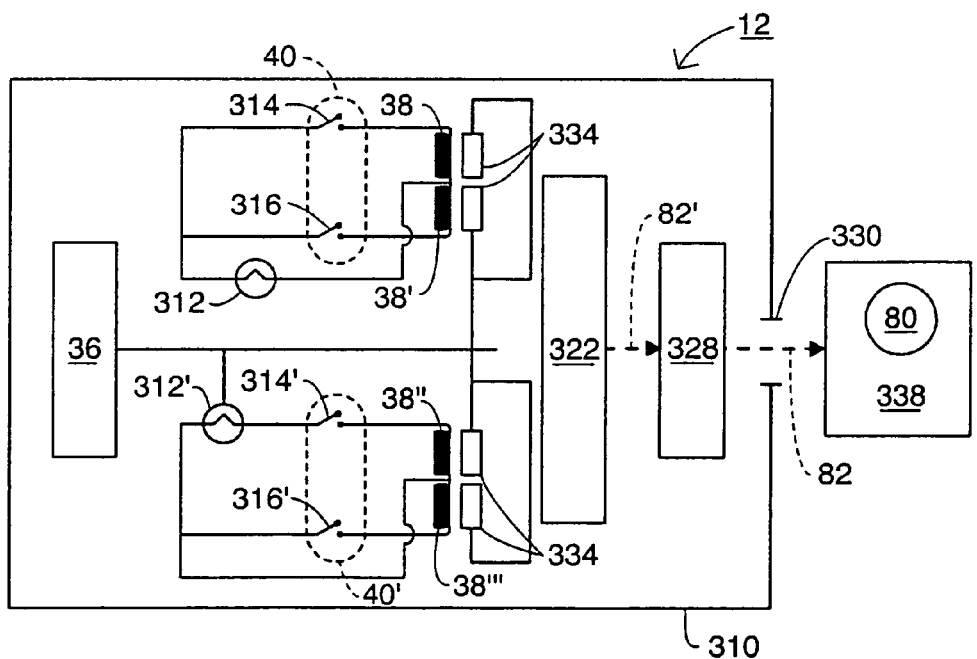
FIG. 8 is a schematic of an in-process repairable e-beam deposition source having a redundant filament usable in the in-process repairable e-beam deposition source of FIGS. 3A and 3B and the e-beam deposition sources in the tape-manufacturing system of FIGS. 1 and 2.

FIG. 7 shows a schematic of the e-beam deposition source 12, similar to the schematic in FIG. 6, the difference is that FIG. 7 includes a quadruple-filament (four filaments 38, 38', 38", and 38''') in a single-power-supply electron gun 310. The e-beam deposition source 12 includes an electron gun 310, further including a high-voltage power supply (HVPS) 312, a filament switching mechanism 40 including switch 314 and 316, a second filament switching mechanism 40' including switch 314' and 316', filaments 38, 38', 38" and 38''', a filament monitor 36, four shutters 334, a beam control unit 322, an e-beam 82', a series of bending magnets 328, an aperture 330, and an e-beam 82. The hearth 338 and its embedded rod 80 may be identical to those in FIG. 6.

The electron gun 310 is a modified version of a commercially available, thermionic electron heating device, with the modifications explained below. The elements include the high voltage power supply 312; the filament switching mechanism 40 including switches 314 and 316; the second filament switching mechanism 40' including switches 314' and 316'; the filaments 38, 38', 38" and 38'''; the filament monitor 36; the shutters 334; the beam control unit 322; the e-beam 82'; the bending magnets 328; the aperture 330; and the e-beam 82 have descriptions to the identically named elements in FIG. 6.

The high-voltage power supply (HVPS) 312; the switches 314, 316, 314' and 316'; and the filaments 38, 38', 38" and 38''' are all electrically connected in a circuit. A first circuit includes high-voltage power supply (HVPS) 312, the switch 314, and the filaments 38. A second circuit includes high-voltage power supply (HVPS) 312, the switch 316, and the filaments 38'. A second circuit includes high-voltage power supply (HVPS) 312, the switch 314', and the filaments 38". A fourth circuit includes high-voltage power supply (HVPS) 312, the switch 316', and the filaments 38'''. The filament monitor 36 is electrically connected to this circuit, and to the high-voltage power supply (HVPS) 312, the beam control unit 322, and the shutters 334. The bending magnets 328 exist inside the electron gun 310 in alignment with the e-beam 82'. The aperture 330, through which the e-beam 82 exits, is cut into the body of the electron gun 310.

The operation begins with the switches 316, 314', and 316' open and the switch 314 closed. The shutters 334 are initially closed. The high-voltage power supply (HVPS) 312 is turned on gradually and current flows through the circuit, gradually heating filament 38, allowing the filament 38 to thermally adjust. When the current in the filament 38 reaches a predetermined amount of approximately 50-100 microamperes (μA) and the emission current reaches a predetermined amount, the shutter 334 in front of filament 38 is opened and the filament monitor 36 instructs the beam control unit 322 to begin sweeping the e-beam 82 over the surface of the rod 80, evaporating the evaporant material of rod 80 for deposition onto a substrate.

As with the e-beam deposition source 12 of FIG. 6, the filament 38 begins to wear. The controller 16 monitors the deposition rate on the tape substrate 18 and adjusts the rate at which it unreels, substantially as described above.

Also as described above, the filament monitor 36 monitors the current in the filament 38 and the emission current, passing this data to controller 16 which in turn may pass the data to a PC. When the filament 30 deviates from a predetermined benchmark, as described above, the controller 16 instructs the filament switching mechanism 40 by means of filament monitor 36 to open the switch 314, shutting off the filament 38. Simultaneously, the controller 16 instructs the isolation mechanism 20 to close and the tape translation mechanism 18 to adjust the advancement of the tape substrate 18 appropriately. The controller 16 then instructs the filament switching mechanism 40 by means of filament monitor 36 to close the switch 316, while simultaneously instructing the high-voltage power supply (HVPS) 312 to slowly increase the current in filament 38. When this current has reached a predetermined amount and the emission current has reached its predetermined amount, the controller 16 to close the shutter 334 in front of filament 38 and open the shutter 334 in front of filament 38', allowing the e-beam 82 to strike the surface of the rod 82, vaporizing evaporant material that eventually is deposited on the substrate tape 28. Simultaneously, the controller 16 instructs the beam to control unit 322 to readjust the e-beam 82' direction and sweep pattern in the beam control unit 322 to compensate for the slight shift in position of the electron source (a different filament). At this point, depending on how long the e-beam deposition source 12 has been down, some time may be needed for the rod 80 to absorb enough energy from the e-beam 82 to reach its operating temperature. When all the above is complete, the controller 16 instructs the isolation mechanism 20 to reopen the line-of-sight path to substrate tape 20 and reestablish the tape-manufacturing system 10 run by increasing the rate advancement of the substrate tape 28.

When the filament 38' exhibits imminent failure, the system changes to the filament 38" in substantially the same way as described above. The same change occurs again when the filament 38" begins to fail, in its turn, and the system activates the filament 38'''.

Turning now to FIG. 8 that shows a schematic of the e-beam deposition source 12, similar to the schematic in FIG. 6, the difference is that the electron gun 10 of FIG. 8 includes quadruple filaments (i.e., filaments 38, 38', 38" and 38''') and dual high-voltage power supply (HVPS) 312 and 312'. The e-beam deposition source 12 includes an electron gun 310, further including a high-voltage power supply (HVPS) 312, a filament switching mechanism 40 including switch 314 and 316, a second filament switching mechanism 40' including switch 314' and 316', a filaments 38, 38', 38" and 38''', a filament monitor 36, four shutters 334, a beam control unit 322, an e-beam 82', a series of bending magnets 328, an aperture 330, and an e-beam 82. The hearth 338 and its embedded rod 80 may be identical to those in FIG. 6.

The electron gun 310 is a modified version of a commercially available, thermionic electron heating device, with the modifications explained below. The element's high voltage power supply 312; the filament switching mechanism 40 including switches 314 and 316; the second filament switching mechanism 40' including switches 314' and 316'; the filaments 38, 38', 38" and 38'''; the filament monitor 36; the shutters 334; the beam control unit 322; the e-beam 82'; the bending magnets 328; the aperture 330; and the e-beam 82 have descriptions to the identically named elements in FIG. 6.

The high-voltage power supply (HVPS) 312; the switches 314 and 316; and the filaments 38, and 38' are all electrically connected in a circuit. The high-voltage power supply (HVPS) 312'; the switches 314' and 316'; and the filaments 38" and 38''' are all electrically connected in another circuit. The filament monitor 36 is electrically connected to the circuits and both high-voltage power supplies (HVPS) 312 and 312', the beam control unit 322, and the shutters 334. The bending magnets 328 exist inside the electron gun 310 in alignment with the e-beam 82'. The aperture 330, through which the e-beam 82 exits, is cut into the body of the electron gun 310.

The operation of the e-beam deposition source 12 is substantially the same as those illustrated in FIGS. 6 and 7, except that when filament 38" fails in addition to a switching the filament 38''', the high-voltage power supply (HVPS) 312 is switched to high-voltage power supply (HVPS) 312'.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

It should be understood that all such modifications and improvements have been deleted herein for the sake of conciseness and readability but are properly within the scope of the following claims.

The invention claimed is:

1. A method for coating at least one tape substrate said method comprising the steps of:
providing at least a portion of at least one tape substrate to an enlarged deposition zone, defined by at least two electron beam (e-beam) deposition sources, the at least two e-beam deposition sources include first and second e-beam sources, the first and second e-beam sources have first and second evaporant material flux profiles that are partially overlapped such that a first waning portion of the first evaporant material flux profile is superimposed with a second waning portion of the second evaporant material flux profile to create a combined evaporant material flux substantially the same as at a center of the first evaporant material flux profile to form a substantially flat combined evaporant material flux profile;
communicating an evaporant material from the at least two e-beam deposition sources with the at least a portion of at least one tape substrate to deposit a coating thereon, the evaporant material from each of the e-beam deposition sources having substantially the same composition;
communicating an assist beam of a species to the evaporant material communicating with the at least a portion of at least one tape substrate such that the coating is biaxially textured;
providing at least another portion of at least one tape substrate to the enlarged deposition zone;
communicating the evaporant material from the at least two e-beam deposition sources with the at least another portion of at least one tape substrate to deposit a coating thereon; and
communicating an assist beam of the species to the evaporant material communicating with the at least another portion of at least one substrate such that the coating is biaxially textured.

2. The method of claim 1, wherein the at least two electron beam (e-beam) deposition sources are capable of in-process repair.

3. A method of forming a high temperature superconducting (HTS) conductor structure, comprising the steps of:
translating a tape substrate through an evacuated chamber of a manufacturing system, the evacuated chamber having (i) a plurality of e-beam sources arranged serially to create an elongated coating deposition zone along a length of the tape substrate, the plurality of e-beam sources including first and second e-beam sources, the first and second e-beam sources having first and second evaporant material flux profiles that are partially overlapped such that a first waning portion of the first evaporant material flux profile is superimposed with a second waning portion of the second evaporant material flux profile to create a combined evaporant material flux substantially the same as at a center of the first evaporant material flux profile, the elongated coating deposition zone having an increased area compared to a deposition zone defined by a single e-beam source, and (ii) at least one material source;
operating the plurality of e-beam sources to form evaporant material from the at least one material source;
irradiating the evaporant material with a species from an assist source such that the evaporant material deposits on the tape substrate to form a biaxially textured coating on the tape substrate; and
repairing the first e-beam source while maintaining vacuum in the evacuated chamber.

4. The method of claim 3, wherein the biaxially textured coating consist essentially of MgO or YSZ.

5. The method of claim 3, wherein the biaxially textured coating is deposited at a rate of at least 1 Angstrom per second.

6. The method of claim 3, wherein the assist source is oriented such that a beam of the species from the assist source form an incident angle between 30 degrees and 50 degrees with respect to a surface of the tape substrate.

7. The method of claim 6, wherein the assist source is an ion source, the species from the assist source comprising ions.

8. The method of claim 6, wherein the beam of species from the assist source is collimated.

9. The method of claim 3, further comprising monitoring wear the first e-beam source.

10. The method of claim 9, wherein wear is monitored by monitoring a change in resistance the first e-beam source.

11. The method of claim 3, wherein the first e-beam source has a line of sight to the substrate as the substrate translates through the evacuated chamber, the method further comprising blocking the line of sight of the first e-beam source to isolate the first e-beam source from the substrate.

12. The method of claim 11, wherein the first e-beam source has a plurality of filaments, and repairing is carried out by shutting down the first e-beam source and switching operation from one filament to another filament of the first e-beam source.

13. The method of claim 11, wherein the manufacturing system includes an auxiliary vacuum chamber in communication with evacuated chamber, and repairing is carried out by retracting the first e-beam source into the auxiliary chamber, closing off the auxiliary chamber from the evacuated chamber, accessing first e-beam source in the auxiliary chamber while vacuum in the evacuated chamber is maintained.

14. The method of claim 13, further comprising reestablishing vacuum in the auxiliary chamber after repairing the first e-beam source, followed by reestablishing communication between the auxiliary chamber and the evacuated chamber.

15. The method of claim 3, wherein translation of the tape substrate and deposition of the biaxially textured coating thereon is continued during repairing.

16. The method of claim 15, wherein translating is carried out at a reduced translational velocity during repairing.

17. A method of forming a high temperature superconducting (HTS) conductor structure, comprising the steps of:
translating a tape substrate through an evacuated chamber of a manufacturing system, the evacuated chamber having (i) a plurality of e-beam sources arranged serially to create an elongated coating deposition zone along a length of the tape substrate, the plurality of e-beam sources including first and second e-beam sources and the first e-beam source having a line of sight to the substrate as the substrate translates through the evacuated chamber, the first and second e-beam sources having first and second evaporant material flux profiles that are partially overlapped such that a first waning portion of the first evaporant material flux profile is superimposed with a second waning portion of the second evaporant material flux profile to create a combined evaporant material flux substantially the same as at a center of the first evaporant material flux profile, the elongated coating deposition zone having an increased area compared to a deposition zone defined by a single e-beam source, and (ii) at least one material source;
operating the plurality of e-beam sources to form evaporant material from the at least one material source;
irradiating the evaporant material with a species from the an assist source such that the evaporant material deposits on the tape substrate to form a biaxially textured coating on the tape substrate;
monitoring wear of the first e-beam source;
blocking the line of sight of the first e-beam source to isolate the first e-beam source from the substrate; and
repairing the first e-beam source while maintaining vacuum in the evacuated chamber.

* * * * *